(12) United States Patent
Zhang

(10) Patent No.: US 12,111,722 B1
(45) Date of Patent: Oct. 8, 2024

(54) SOLID-STATE DRIVE PROCESSING METHOD, SYSTEM, AND DEVICE, AND NON-VOLATILE READABLE STORAGE MEDIUM

(71) Applicant: SUZHOU METABRAIN INTELLIGENT TECHNOLOGY CO., LTD., Jiangsu (CN)

(72) Inventor: Zhen Zhang, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/689,240

(22) PCT Filed: Sep. 28, 2022

(86) PCT No.: PCT/CN2022/122297
§ 371 (c)(1),
(2) Date: Mar. 5, 2024

(87) PCT Pub. No.: WO2023/098269
PCT Pub. Date: Jun. 8, 2023

(30) Foreign Application Priority Data

Nov. 30, 2021 (CN) .......................... 202111442531.2

(51) Int. Cl.
*G06F 11/10* (2006.01)
*G06F 11/07* (2006.01)
(Continued)

(52) U.S. Cl.
CPC ...... *G06F 11/1016* (2013.01); *G06F 11/1068* (2013.01)

(58) Field of Classification Search
CPC .......................... G06F 11/1068; G06F 11/1016
See application file for complete search history.

(56) References Cited

U.S. PATENT DOCUMENTS

| | | | | |
|---|---|---|---|---|
| 5,070,474 A | * | 12/1991 | Tuma | ................... G06F 11/1068 |
| | | | | 714/E11.038 |
| 2007/0226597 A1 | * | 9/2007 | Taito | .................... G06F 11/1068 |
| | | | | 714/E11.038 |

(Continued)

FOREIGN PATENT DOCUMENTS

| | | |
|---|---|---|
| CN | 101770809 A | 7/2010 |
| CN | 102591807 A | 7/2012 |

(Continued)

*Primary Examiner* — Guy J Lamarre
(74) *Attorney, Agent, or Firm* — IPro, PLLC

(57) ABSTRACT

Provided are a solid state drive processing method, system, device, and a non-transitory readable storage medium. The method includes: determining a target data page that is being processed when a target solid-state drive is abnormally powered down; using a next data page of the target data page as a current data page; deciding whether a read-write error exists in the current data page; in response to deciding that a read-write error exists in the current data page, using a next data page of the current data page as the current data page, and returning to execute the deciding whether a read-write error exists in the current data page; and in response to deciding that no read-write error exists in the current data page, storing target data since the next data page of the current data page.

20 Claims, 2 Drawing Sheets

(51) Int. Cl.
   *G06F 11/30*  (2006.01)
   *G06F 13/16*  (2006.01)
   *G06F 13/28*  (2006.01)

(56) References Cited

U.S. PATENT DOCUMENTS

2009/0109786 A1    4/2009  Ye et al.
2018/0068726 A1*  3/2018  Song ...................... G11C 16/16

FOREIGN PATENT DOCUMENTS

| | | | | |
|---|---|---|---|---|
| CN | 102902637 | A | 1/2013 | |
| CN | 104090730 | A | 10/2014 | |
| CN | 105138432 | A | 12/2015 | |
| CN | 107861834 | B * | 6/2020 | .......... G06F 11/1012 |
| CN | 112634975 | A | 4/2021 | |
| CN | 112988467 | A | 6/2021 | |
| CN | 114327258 | A | 4/2022 | |

* cited by examiner

SOLID-STATE DRIVE PROCESSING METHOD, SYSTEM, AND DEVICE, AND NON-VOLATILE READABLE STORAGE MEDIUM

CROSS-REFERENCE TO RELATED APPLICATION

This application claims priority to Chinese Patent Application No. 202111442531.2, entitled "Solid State Drive Processing Method, System, Device, And Computer Storage Medium" filed on Nov. 30, 2021 to China National Intellectual Property Administration, the entire contents of which are incorporated herein by reference.

Technical Field

The disclosure relates to the technical field of solid state drives, and more particularly to a solid state drive processing method, a solid state drive processing system, a solid state drive processing device, a non-transitory readable storage medium and a computer program product.

Background

Currently, if an abnormal power failure happens on the solid state drive during the use thereof, a read-write error will occur, and the read-write error will still occur even if the solid state drive is normally powered on later, so that the accuracy of the data processing on the solid state drive is affected.

In view of the above, an urgent problem to be solved by those skilled in the art at present is how to improve the accuracy of the data processing on the solid state drive.

SUMMARY

The disclosure is to provide a solid state drive processing method, a solid state drive processing system, a solid state drive processing device, a non-transitory readable storage medium and a computer program product.

In order to achieve the above object, the disclosure provides the following technical solutions.

A solid state drive processing method, including:
  determining a target data page that is being processed when a target solid state drive is abnormally powered down;
  using a next data page of the target data page as a current data page;
  deciding whether a read-write error exists in the current data page;
  in response to deciding that the read-write error exists in the current data page, using a next data page of the current data page as the current data page, and returning to execute the deciding whether a read-write error exists in the current data page;
  in response to deciding that no read-write error exists in the current data page, storing target data since the next data page of the current data page.

In some embodiments, the determining a target data page that is being processed when a target solid state drive is abnormally powered down includes:
  determining a target storage block that is being processed when the target solid state drive is abnormally powered down; and
  determining a data page prior to a first free data page in the target storage block as the target data page.

In some embodiments, the deciding whether a read-write error exists in the current data page includes:
  writing a test data into the current data page;
  performing data reading on the current data page to obtain read data;
  deciding whether the read-write error exists based on the test data and the read data;
  in response to deciding that the read-write error exists based on the test data and the read data, determining that the read-write error exists in the current data page;
  in response to deciding that no read-write error exists based on the test data and the read data, determining that no read-write error exists in the current data page.

In some embodiments, the deciding whether the read-write error exists based on the test data and the read data includes:
  deciding whether a UECC error exists based on the test data and the read data.

In some embodiments, after deciding whether a read-write error exists in the current data page, the method further includes accumulating a quantity value of the current data pages with the read-write error.

In some embodiments, a degree of influence on the target solid state drive due to the target solid state drive being abnormally powered down is determined based on the quantity value.

In some embodiments, a performance of the target solid state drive is evaluated based on the quantity value.

In some embodiments, the target data page includes an upper page.

In some embodiments, the target data page includes a lower page.

A solid state drive processing system, including:
  a first determination module configured for determining a target data page that is being processed when a target solid state drive is abnormally powered down;
  a first setting module configured for using a next data page of the target data page as a current data page; and
  a first decision module configured for deciding whether a read-write error exists in the current data page; in response to deciding that the read-write error exists in the current data page, using a next data page of the current data page as the current data page, and returning to execute the deciding whether a read-write error exists in the current data page; and in response to deciding that no read-write error exists in the current data page, storing target data since the next data page of the current data page.

A solid state drive processing device, including:
  a memory configured for storing a computer program; and
  a processor configured for executing the computer program to implement steps of any of the solid state drive processing methods described above.

A non-transitory readable storage medium, wherein the non-transitory readable storage medium is stored with a computer program that, when executed by a processor, implements steps of any of the solid state drive processing methods described above.

BRIEF DESCRIPTION OF THE DRAWINGS

In order to more clearly describe the technical solutions in the embodiments of the disclosure or the related art, the drawings to be used in the illustration of the embodiments or the related art will be briefly introduced below. It will be apparent to those skilled in the art that the drawings in the following description only illustrate embodiments of the disclosure, and based on these drawings, other drawings may be obtained by those skilled in the art without paying any creative works.

DETAILED DESCRIPTION

The technical solutions of embodiments of the disclosure will be described clearly and thoroughly in conjunction with the accompanying drawings of the embodiments of the disclosure. Apparently, the described embodiments are only part of the embodiments of the disclosure, rather than all of the embodiments. Based on the embodiments in the disclosure, all other embodiments obtained by those skilled in the art without involving any creative effort fall within the scope of protection of the disclosure.

Figure 1:
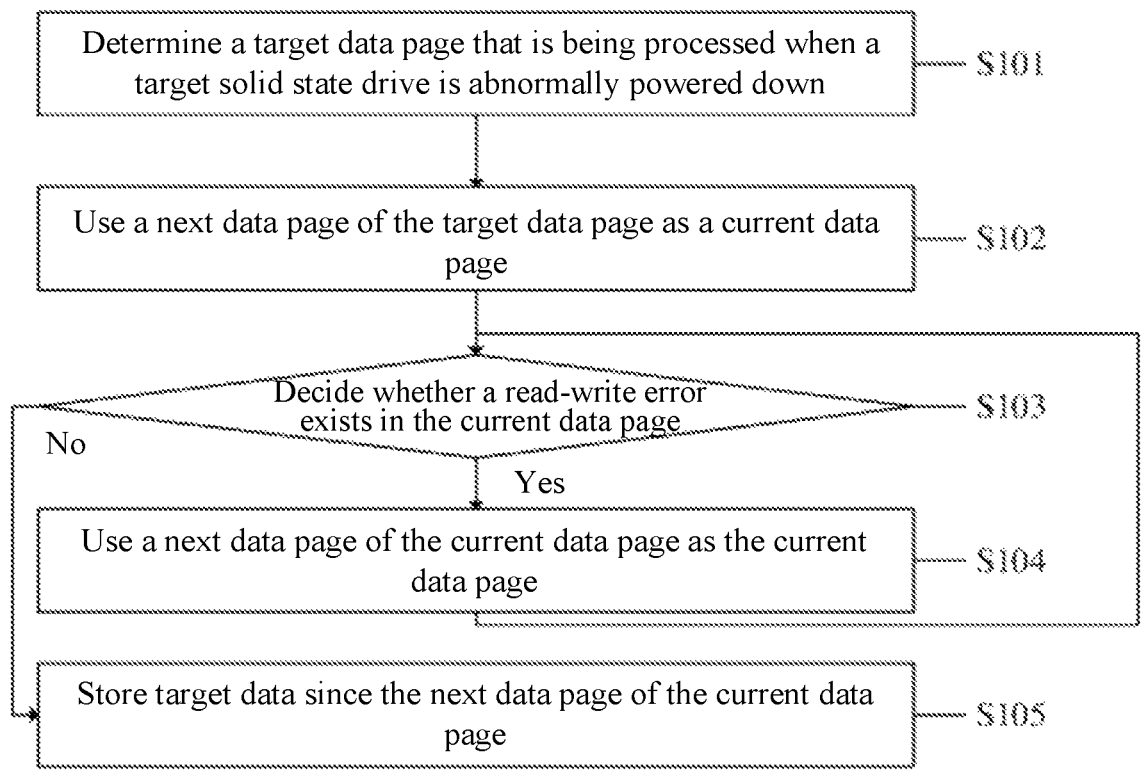
FIG. 1 is a flow chart of a solid state drive processing method according to an embodiment of the disclosure.

Referring to FIG. 1, FIG. 1 is a flow chart of a solid state drive processing method according to an embodiment of the disclosure.

This embodiment provides a solid state drive processing method including steps described below.

At step S101, a target data page that is being processed when a target solid state drive is abnormally powered downed is determined.

In practical applications, when a target solid state drive is abnormally powered down, a read-write error exists in the target data page that is being processed. In this case, if data is still stored since the target data page, a read-write error also easily exists in the newly stored data. In order to avoid this situation, it is necessary to firstly determine the target data page that is being processed when the target solid state drive is abnormally powered down, so as to subsequently determine a normal data page without a read-write error based on the target data page. It should be noted that a data page refers to a minimum unit for writing and reading a solid state drive. The type of the solid state drive may be determined according to actual needs, for example, a NSND FLASH (flash memory) and the like, which is not particularly limited herein.

In an application scenario, the data page is no longer free when data is written to the data page. Therefore, in order to quickly determine the target data page, in the process of determining the target data page that is being processed when the target solid state drive is abnormally powered down, a target storage block that is being processed when the target solid state drive is abnormally powered down may be determined, and a data page prior to a first free data page in the target storage block is determined to be the target data page.

At step S102, a next data page of the target data page is used as a current data page.

In practical applications, since a read-write error exists in the target data page, and new data will be stored in data pages following the target data page, a data page without the read-write error may be screened out from data pages following the target data page, that is to say, a next data page of the target data page may be used as the current data page for subsequent screening.

At step S103, it is decided whether a read-write error exists in the current data page; if the read-write error exists in the current data page, then the method proceeds to step S104; and if no read-write error exists in the current data page, then the method proceeds to step S105.

At step S104, a next data page of the current data page is used as the current data page, and the method returns to step S103.

At step S105, the target data is stored since the next data page of the current data page.

In practical applications, the next data page of the target data page is used as the current data page, and then it is decided whether a read-write error exists in the current data page. If the read-write error exists in the current data page, a next data page of the current data page is used as the current data page, and the method returns to execute the step in which it is decided whether the read-write error exists in the current data page; if no read-write error exists in the current data page, the target data is stored since a next data page of the current data page.

In a specific application scenario, in order to decide whether a read-write error exists in the current data page, a test data may be written into the current data page; data reading is performed on the current data page to obtain read data; whether a read-write error exists is decided based on the test data and the read data; when it is decided that a read-write error exists based on the test data and the read data, it is determined that a read-write error exists in the current data page; when it is decided that no read-write error exists based on the test data and the read data, it is determined that no read-write error exists in the current data page.

In addition, in a practical application scenario, in the process of deciding whether a read-write error exists based on the test data and the read data, it may be decided whether an error such as a UECC error exists based on the test data and the read data. The disclosure does not define this.

In practical applications, after deciding whether a read-write error exists in the current data page, a quantity value of the current data pages with the read-write error may also be accumulated so as to determine a degree of the influence on the target solid state drive due to the target solid state drive being abnormally powered down, or to evaluate the performance of the target solid state drive and the like based on the quantity value. The disclosure does not define this.

In practical applications, the type of the target data page may be determined according to actual needs. For example, the target data page may include an UPPER PAGE, a LOWER PAGE, etc. The upper page refers to mapping two bits on a physical cell, MSB (most significant bit) and LSB (Least Significant Bit), onto two different pages respectively. Accordingly, the page corresponding to LSB is LOWER PAGE, and the page corresponding to MSB is UPPER PAGE.

The disclosure provides a solid state drive processing method, including: determining a target data page that is being processed when a target solid state drive is abnormally powered down; using a next data page of the target data page as a current data page; deciding whether a read-write error exists in the current data page; in response to deciding that a read-write error exists in the current data page, using a next data page of the current data page as the current data page, and returning to execute the step of deciding whether a read-write error exists in the current data page; and in response to deciding that no read-write error exists in the current data page, storing target data since a next data page of the current data page. In the disclosure, a data page, in which no read-write error exists after the solid state drive is abnormally powered down, can be tested out, and the target data is stored since the data page, such that the accuracy of data processing on the solid state drive is ensured.

Figure 2:
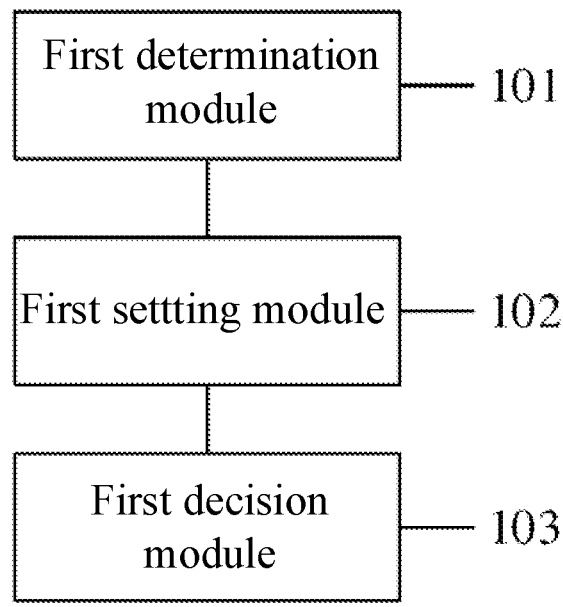
FIG. 2 is a schematic structural diagram of a solid state drive processing system according to an embodiment of the disclosure.

Referring to FIG. 2, FIG. 2 is a schematic structural diagram of a solid state drive processing system according to an embodiment of the disclosure.

This embodiment of the disclosure provides a solid state drive processing system, including:

a first determination module 101 configured for determining a target data page that is being processed when a target solid state drive is abnormally powered down;

a first setting module 102 configured for using a next data page of the target data page as a current data page; and a first decision module 103 configured for deciding whether a read-write error exists in the current data page; in response to deciding that a read-write error exists in the current data page, using a next data page of the current data page as the current data page, and returning to execute the deciding whether a read-write error exists in the current data page; and in response to deciding that no read-write error exists in the current data page, storing target data since a next data page of the current data page.

According to a solid state drive processing system provided by an embodiment of the disclosure, the first determination module may include:

a first determination unit configured for determining a target storage block that is being processed when the target solid state drive is abnormally powered down; and a second determination unit configured for determining a data page prior to a first free data page in the target storage block as the target data page.

According to a solid state drive processing system provided by an embodiment of the disclosure, the first decision module may include:

a first writing unit configured for writing a test data into the current data page;

a first reading unit configured for performing data reading on the current data page to obtain read data; and a first decision unit configured for deciding whether a read-write error exists based on the test data and the read data; in response to deciding that a read-write error exists based on the test data and the read data, deciding that a read-write error exists in the current data page; and in response to deciding that no read-write error exists based on the test data and the read data, deciding that no read-write error exists in the current data page.

According to a solid state drive processing system provided by an embodiment of the disclosure, the first decision unit may be further configured for deciding whether a UECC error exists based on the test data and the read data.

The solid state drive processing system provided by an embodiment of the disclosure may further include:

a first accumulation module configured for accumulating a quantity value of the current data pages with the read-write error after the first decision module decides whether the read-write error exists in the current data page.

According to a solid state drive processing system provided by an embodiment of the disclosure, the target data page includes an upper page.

According to a solid state drive processing system provided by an embodiment of the disclosure, the target data page includes a lower page.

Figure 3:
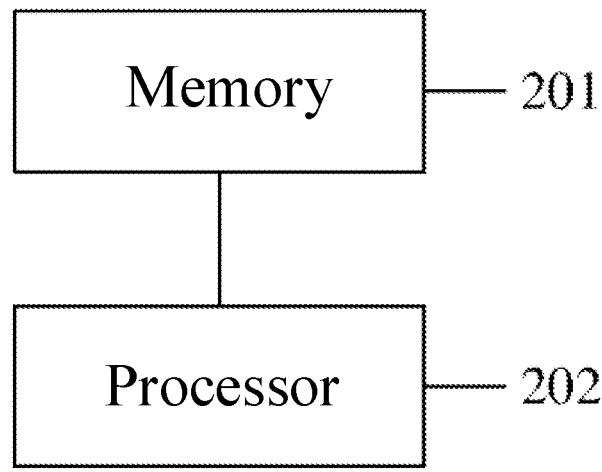
FIG. 3 is a schematic structural diagram of a solid state drive processing device according to an embodiment of the disclosure.

The disclosure also provides a solid state drive processing device and a non-transitory readable storage medium, which both have the corresponding effects of the solid state drive processing method provided by the embodiment of the disclosure. Referring to FIG. 3, FIG. 3 is a schematic structural diagram of a solid state drive processing device according to an embodiment of the disclosure.

An embodiment of the disclosure provides a solid state drive processing device including a memory 201 and a processor 202. The memory 201 is stored with a computer program that, when executed by the processor 202, implements the following steps of:

determining a target data page that is being processed when a target solid state drive is abnormally powered down;

using a next data page of the target data page as a current data page;

deciding whether a read-write error exists in the current data page;

in response to deciding that a read-write error exists in the current data page, using a next data page of the current data page as the current data page, and returning to execute the step of deciding whether a read-write error exists in the current data page; and in response to deciding that no read-write error exists in the current data page, storing target data since a next data page of the current data page.

An embodiment of the disclosure provides a solid state drive processing device including a memory 201 and a processor 202, and the memory 201 is stored with a computer program that, when executed by the processor 202, implements the steps of determining a target storage block that is being processed when the target solid state drive is abnormally powered down; and determining a data page prior to a first free data page in the target storage block as the target data page.

An embodiment of the disclosure provides a solid state drive processing device including a memory 201 and a processor 202, and the memory 201 is stored with a computer program that, when executed by the processor 202, implements the steps of writing a test data into the current data page; performing data reading on the current data page to obtain read data; deciding whether a read-write error exists based on the test data and the read data; in response to deciding that a read-write error exists based on the test data and the read data, determining that a read-write error exists in the current data page; and in response to deciding that no read-write error exists based on the test data and the read data, determining that no read-write error exists in the current data page.

An embodiment of the disclosure provides a solid state drive processing device including a memory 201 and a processor 202, and the memory 201 is stored with a computer program that, when executed by the processor 202, implements the step of deciding whether a UECC error exists based on the test data and the read data.

An embodiment of the disclosure provides a solid state drive processing device including a memory 201 and a processor 202, and the memory 201 is stored with a computer program that, when executed by the processor 202, implements the step of accumulating a quantity value of the current data pages with the read-write error after deciding whether a read-write error exists in the current data page.

An embodiment of the disclosure provides a solid state drive processing device including a memory 201 and a processor 202, and the memory 201 is stored with a computer program that, when executed by the processor 202, implements the steps of determining, based on the quantity value, a degree of influence on the target solid state drive due to the target solid state drive being abnormally powered down on.

An embodiment of the disclosure provides a solid state drive processing device including a memory 201 and a processor 202, and the memory 201 is stored with a computer program that, when executed by the processor 202, implements the step of evaluating a performance of the target solid state drive based on the quantity value.

An embodiment of the disclosure provides a solid state drive processing device including a memory 201 and a processor 202, and the memory 201 is stored with a computer program that, when executed by the processor 202, implements a step in which the target data page includes an upper page.

An embodiment of the disclosure provides a solid state drive processing device including a memory 201 and a processor 202, and the memory 201 is stored with a computer program that, when executed by the processor 202, implements a step in which the target data page includes a lower page.

Figure 4:
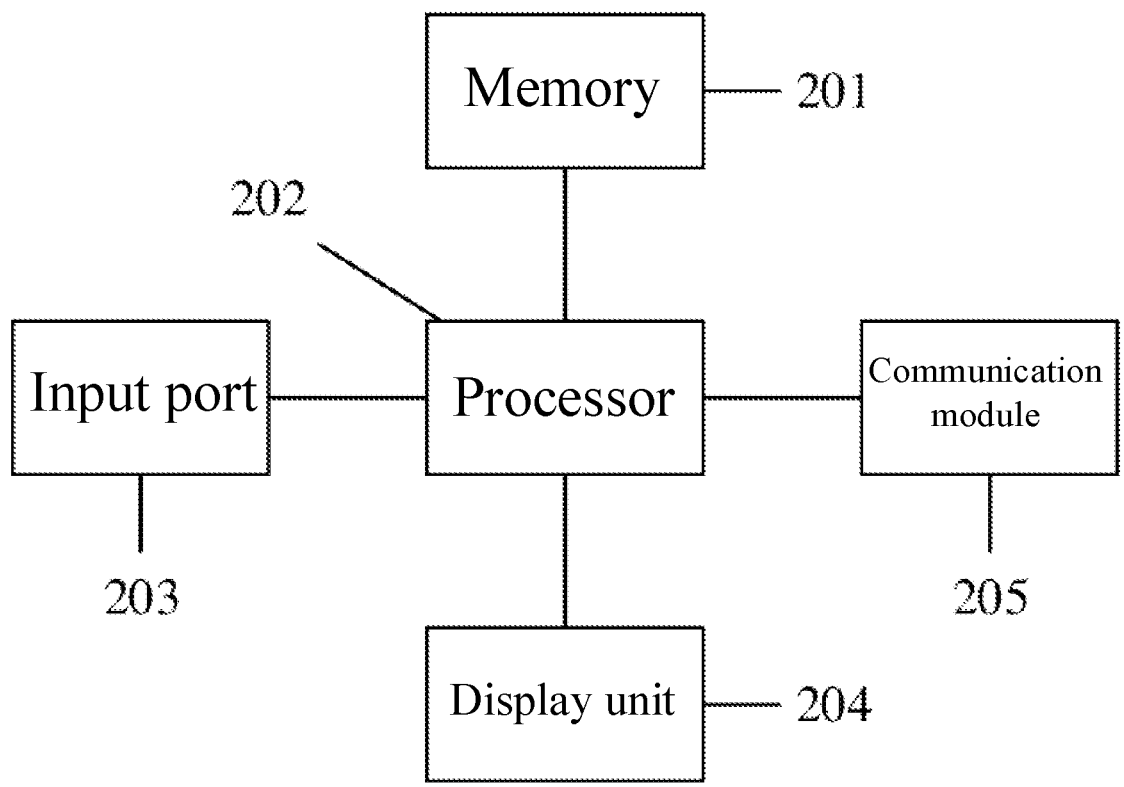
FIG. 4 is another schematic structural diagram of a solid state drive processing device according to an embodiment of the disclosure.

Referring to FIG. 4, another solid state drive processing device provided by an embodiment of the disclosure may further include: an input port 203 connected to the processor 202 for transmitting an externally input command to the processor 202; a display unit 204 connected to the processor 202 for displaying a processing result of the processor 202 to the outside; and a communication module 205 connected to the processor 202 for enabling the solid state drive processing device to communicate with the outside. The display unit 204 may be a display panel, a laser scanning display, etc. The communication modes adopted by the communication module 205 include, but are not limited to, mobile high-definition link technology (HML), a universal serial bus (USB), a high-definition multimedia interface (HDMI), and wireless connection: a wireless fidelity technology (WiFi), a Bluetooth communication technology, a low-power Bluetooth communication technology, and a communication technology based on IEEE802.11s.

An embodiment of the disclosure provides a non-transitory readable storage medium stored with a computer program that, when executed by a processor, implements the steps of:

determining a target data page that is being processed when a target solid state drive is abnormally powered down;

using a next data page of the target data page as a current data page;

deciding whether a read-write error exists in the current data page;

in response to deciding that a read-write error exists in the current data page, using a next data page of the current data page as the current data page, and returning to execute the step of deciding whether a read-write error exists in the current data page; and in response to deciding that no read-write error exists in the current data page, storing target data since a next data page of the current data page.

An embodiment of the disclosure provides a non-transitory readable storage medium stored with a computer program that, when executed by a processor, implements the steps of determining a target storage block that is being processed when the target solid state drive is abnormally powered down; and determining a data page prior to a first free data page in the target storage block as the target data page.

An embodiment of the disclosure provides a non-transitory readable storage medium stored with a computer program that, when executed by a processor, implements the steps of writing a test data into the current data page; performing data reading on the current data page to obtain read data; deciding whether a read-write error exists based on the test data and the read data; in response to deciding that a read-write error exists based on the test data and the read data, determining that a read-write error exists in the current data page; and in response to deciding that no read-write error exists based on the test data and the read data, determining that no read-write error exists in the current data page.

An embodiment of the disclosure provides a non-transitory readable storage medium stored with a computer program that, when executed by a processor, implements the steps of deciding whether a UECC error exists based on the test data and the read data.

An embodiment of the disclosure provides a non-transitory readable storage medium stored with a computer program that, when executed by a processor, implements the step of accumulating a quantity value of the current data pages with the read-write error after deciding whether a read-write error exists in the current data page.

An embodiment of the disclosure provides a non-transitory readable storage medium stored with a computer program that, when executed by a processor, implements the step of determining, based on the quantity value, a degree of influence on the the target solid state drive due to the target solid state drive being abnormally powered down.

An embodiment of the disclosure provides a non-transitory readable storage medium stored with a computer program that, when executed by a processor, implements the step of evaluating a performance of the target solid state drive based on the quantity value.

An embodiment of the disclosure provides a non-transitory readable storage medium stored with a computer program that, when executed by a processor, implements a step in which the target data page includes an upper page.

An embodiment of the disclosure provides a non-transitory readable storage medium stored with a computer program that, when executed by a processor, implements a step in which the target data page includes a low page.

The non-transitory readable storage medium involved in the present disclosure includes a random access memory (RAM), a memory, a read-only memory (ROM), an electrically programmable ROM, an electrically erasable programmable ROM, a register, a hard disk, a removable disk, CD-ROM, or any other form of storage medium known in the related art.

For explanations of relevant parts of the solid state drive processing system, the solid state drive processing device, and the non-transitory readable storage media provided by the embodiments of the disclosure, please refer to the detailed description of the corresponding parts of the solid state drive processing method provided by the embodiments of the present disclosure, which will not be repeated here. In addition, the parts of the above technical solutions provided by the embodiments of the present disclosure that are consistent with the implementation principles of the corresponding technical solutions in the related art have not been described in detail to avoid excessive redundancy.

It should also be noted, relational terms such as "first" and "second" used herein are merely used to distinguish an entity or operation from another entity or operation, and do not necessarily require or imply the existence of any such actual relationship or sequence between these entities or operations. Furthermore, the terms "comprising", "including" or any other variation thereof are intended to cover a non-exclusive inclusion, such that a process, method, article, or terminal device including a list of elements includes not only those elements but also other elements not expressly listed, or elements inherent to the process, method, article or terminal device. When there are no further limitations, an element defined by the phrase "comprising a . . . " does not exclude the presence of additional identical elements in the process, method, article or apparatus comprising said element.

The above description of the disclosed embodiments is provided to enable those skilled in the art to make or use the present application. Various modifications to these embodiments will be readily apparent to those skilled in the art, and the general principles defined herein may be implemented in other embodiments without departing from the spirit or scope of the application. Therefore, the present application will not be limited to the embodiments is the present disclosure, but will comply with the widest scope consistent with the principles and novel features disclosed herein.

The invention claimed is:

1. A solid state drive processing method, comprising:
   determining a target data page that is being processed when a target solid state drive is abnormally powered down;
   using a next data page of the target data page as a current data page;
   deciding whether a read-write error exists in the current data page;
   in response to deciding that the read-write error exists in the current data page, using a next data page of the current data page as the current data page, and returning to execute the deciding whether a read-write error exists in the current data page;
   in response to deciding that no read-write error exists in the current data page, storing target data since the next data page of the current data page.

2. The method according to claim 1, wherein the determining a target data page that is being processed when a target solid state drive is abnormally powered down comprises:
   determining a target storage block that is being processed when the target solid state drive is abnormally powered down; and
   determining a data page prior to a first free data page in the target storage block as the target data page.

3. The method according to claim 1, wherein the deciding whether a read-write error exists in the current data page comprises:
   writing a test data into the current data page;
   performing data reading on the current data page to obtain read data; and
   deciding whether the read-write error exists based on the test data and the read data.

4. The method according to claim 3, further comprising:
   in response to deciding that the read-write error exists based on the test data and the read data, determining that the read-write error exists in the current data page;
   in response to deciding that no read-write error exists based on the test data and the read data, determining that no read-write error exists in the current data page.

5. The method according to claim 3, wherein the deciding whether the read-write error exists based on the test data and the read data comprises:
   deciding whether a UECC error exists based on the test data and the read data.

6. The method according to claim 5, wherein the target data page comprises an upper page.

7. The method according to claim 5, wherein the target data page comprises a lower page.

8. The method according to claim 1, wherein after deciding whether a read-write error exists in the current data page, the method further comprises:
   accumulating a quantity value of the current data pages with the read-write error.

9. The method according to claim 8, further comprising:
   determining, based on the quantity value, a degree of influence on the target solid state drive due to the target solid state drive being abnormally powered down.

10. The method according to claim 8, further comprising:
    evaluating a performance of the target solid state drive based on the quantity value.

11. The method according to claim 1, wherein a type of solid state drive comprises a flash memory.

12. A computer program product, wherein the computer program product comprises readable program instructions that, when executed by a processor of a solid state drive processing device, cause the solid state drive processing device to perform the solid state drive processing method according to claim 1.

13. A solid state drive processing device, comprising:
    a memory configured for storing a computer program; and
    a processor configured for executing the computer program to implement steps of:
    determining a target data page that is being processed when a target solid state drive is abnormally powered down;
    using a next data page of the target data page as a current data page;
    deciding whether a read-write error exists in the current data page;
    in response to deciding that the read-write error exists in the current data page, using a next data page of the current data page as the current data page, and returning to execute the deciding whether a read-write error exists in the current data page;
    in response to deciding that no read-write error exists in the current data page, storing target data since the next data page of the current data page.

14. The solid state drive processing device according to claim 13, further comprising:
    an input port connected to the processor for transmitting an externally input command to the processor;
    a display unit connected to the processor for displaying a processing result of the processor to the outside; and
    a communication module connected to the processor for enabling the solid state drive processing device to communicate with the outside.

15. The solid state drive processing device according to claim 14, wherein the display unit comprises a display panel and a laser scanning display.

16. The solid state drive processing device according to claim 14, wherein communication modes of the communication module comprise a mobile high-definition link technology, a universal serial bus, a high-definition multimedia interface, a wireless connection, a wireless fidelity technology, a Bluetooth communication technology, a low-power consumption Bluetooth communication technology and a communication technology based on IEEE802.11s.

17. The solid state drive processing device according to claim 13, wherein the processor is further configured for implementing steps of:
  determining a target storage block that is being processed when the target solid state drive is abnormally powered down; and
  determining a data page prior to a first free data page in the target storage block as the target data page.

18. The solid state drive processing device according to claim 13, wherein the processor is further configured for implementing steps of:
  writing a test data into the current data page;
  performing data reading on the current data page to obtain read data; and
  deciding whether the read-write error exists based on the test data and the read data.

19. The solid state drive processing device according to claim 18, wherein the processor is further configured for implementing steps of:
  in response to deciding that the read-write error exists based on the test data and the read data, determining that the read-write error exists in the current data page;
  in response to deciding that no read-write error exists based on the test data and the read data, determining that no read-write error exists in the current data page.

20. A non-transitory readable storage medium, wherein the non-transitory readable storage medium is stored with a computer program that, when executed by a processor, implements steps of:
  determining a target data page that is being processed when a target solid state drive is abnormally powered down;
  using a next data page of the target data page as a current data page;
  deciding whether a read-write error exists in the current data page;
  in response to deciding that the read-write error exists in the current data page, using a next data page of the current data page as the current data page, and returning to execute the deciding whether a read-write error exists in the current data page;
  in response to deciding that no read-write error exists in the current data page, storing target data since the next data page of the current data page.

\* \* \* \* \*